United States Patent
Lim

(10) Patent No.: US 6,950,351 B2
(45) Date of Patent: Sep. 27, 2005

(54) REPAIR CIRCUIT

(75) Inventor: Yang Kyu Lim, Seoul (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 111 days.

(21) Appl. No.: 10/615,382

(22) Filed: Jul. 9, 2003

(65) Prior Publication Data

US 2004/0013028 A1 Jan. 22, 2004

(30) Foreign Application Priority Data

Jul. 15, 2002 (KR) ................................ 10-2002-0041316

(51) Int. Cl.$^7$ ................................................. G11C 7/00
(52) U.S. Cl. ................ 365/200; 365/225.7; 365/230.06
(58) Field of Search ............................. 365/200, 225.7, 365/230.06, 230.03

(56) References Cited

U.S. PATENT DOCUMENTS 6,084,807 A * 7/2000 Choi .......................... 365/200

* cited by examiner

Primary Examiner—David Lam
(74) Attorney, Agent, or Firm—Mayer, Brown, Rowe & Maw LLP

(57) ABSTRACT

A repair circuit includes a bit fail repair block for using the column and row addresses to determine whether they are fail addresses in order to decide whether bit repair for the fail addresses are to be performed, a row repair block for determining whether the row addresses are fail and deciding whether row repair for the row addresses are to be performed depending on the output of the bit fail repair block, and a plurality of column repair blocks for deciding whether column repair for the column addresses are to be performed and deciding whether a normal column driver must be selected, depending on the column address, column fuse boxes and an output signal of the bit fail repair block.

5 Claims, 5 Drawing Sheets

REPAIR CIRCUIT

BACKGROUND OF THE INVENTION

1. Field of the Invention

The present invention relates to a repair circuit in semiconductor memory devices, and more particularly, to a repair circuit that is applied to semiconductor memory devices for receiving a X (row) address and a Y (column) address at a time without receiving them divisionally, and semiconductor memory devices operating as a single read mode and a single write mode with no burst or a page mode without address multiplexing.

2. Background of the Related Art

In a conventional synchronous DRAM (hereinafter called 'SDRAM'), if there occurs fail as shown in FIG. 1, the row address and the column address are first divided. Thereafter, in case of row fail, the word line may be replaced in order to repair the fail. In case of column fail, all of column select (Yi) signals may be replaced in order to repair the fail.

The row fail means that in the fail address, the row addresses are same and the column addresses are different. In this case, it would be effective to replace the entire word lines with a corresponding the row address. Likewise, the column fail means that in the fail address, the column addresses are same and the row addresses are different. At this time, it would be effective to replace the column address with a corresponding column select (Yi) signal.

However, random bit fail not row and column fail means that only 1 (one) bit is fail. Likewise in the above, the only 1 bit having fail is not replaced but all the row and column addresses of fail addresses are replaced. For example, if X=00 is inputted, a repaired word line is enabled regardless of the column address. This is not the type in which only one bit is replaced.

Referring now to FIG. 1, the conventional repair circuit will be described in detailed.

As shown in FIG. 1, the repair circuit includes an row repair block 100, a column repair block 200 and a cell block 300.

If fail 0 being random bit fail occurs, addresses corresponding to the row address are replaced, whereby the entire word lines are changed from a normal word line to a repair word line.

If fail 1 being random bit fail occurs, only the column address is replaced, whereby the entire column addresses are changed from the normal column address to the repair column address in the cell block 300.

FIG. 2 is a detailed circuit diagram of the row repair block 100 shown in FIG. 1.

The row repair block 100 has fuses X fuse as many as the number of the repair word line.

In FIG. 2, the cell block 300 includes N number of blocks each having repair word line. However, this is not true in all the memory semiconductors. The blocks are related to the repair efficiency. Therefore, a small number of the blocks may be added and a large number of the blocks may be added. A cell matrix is divided into N numbers and may be inserted into every block. Otherwise, the repair word line for repairing fail may be located at one position. Though there are many cases, but there is no difference in the method of repairing fail except that only its arrangement is different. It is shown in FIG. 2 that the cell block 300 is largely divided into N numbers, there are N numbers of the repair word line and N numbers of the fuses X fuse within the row repair block corresponding to the repair word line. Further, there are N numbers of repair word line drivers 10 for driving the repair word line. Also, the repair circuit of FIG. 2 includes a fuse summation block 110 for summating an output signal rwl_enb_n of each of the fuses X fuse.

Referring now to FIG. 3, the operation of the fuse summation block 110 will be described. The block 110 performs a NAND combination for the output signals rwl_enb-0, rwl_enb_1, . . . , rwl_enb_n of each of the fuses to produce a fuse summation signal Fuse_sumb. The output signal rwl_enb_n is a signal to keep Low level when the failed row address is inputted since the row address with fail is set in the fuse and to shift from Low level to High level when a normal address (not the failed row address) is inputted. Therefore, the normal address shifts from Low level to High level same to the fuse summation signal Fuse_sumb. The failed row address keeps Low level. The fuse summation block 110 has an output signal of Low level when at least one of the input signals keep Low level, which may be said a simple AND combination of the input signal. This is because the input signal is enabled to be Low level. If it is a circuit the input signal of which is enabled to be High level, it is required that fuse summation block 110 be OR-combined. This is the circuit the input signal of which is enabled to be Low level. The fuse summation signal Fuse_sumb is used as an enable signal in the normal word line driver 20 and also used as a signal to drive the repair word line along with the output signal rwl_enb_n.

If the output signal rwl_enb_n keeps Low level and the fuse summation signal Fuse_sumb keeps Low level, the repair word line is enabled. Only one of the output signals rwl_enb_n from 0 to n becomes Low level. The repair word line is driven in the block that became Low level.

In the normal word line driver 20, the output signal rwl_enb_n that became Low level is used as a disable signal. In other words, if the output signal rwl_enb_n becomes Low level, the path along which the normal word line operates is disabled. Also, if the output signal rwl_end_n becomes High level, the normal word line operates. At this time, all the normal word lines do not operate but the normal word line corresponding to the row address operates.

By reference to FIG. 4, the column repair block 200 will be described.

The block 200 corresponds to a repair circuit for the column address.

This block includes a column fuse box 30, a repair column select unit 40 and a normal column select unit 50 as main components. The column fuse box 30 will be first explained. The column fuse enable signal Yfuse_enable is a signal generated when the word line is enabled by the row address.

If the fuse enable signal Yfuse_enable is inputted, the column fuse box 30 is ready to operate. At this time, if the column address is inputted, the box 30 discriminates whether the address is a fail address or a normal address to output the output signal Ryi_enb. If the column address is the fail address, the output signal Ryi_enb becomes Low level to enable the repair column select unit 40, which drives the column repair driver 60. Due to this, a repair column select signal Repair Ys is enabled. Further, the signal Ryi_enb makes the normal column select unit 50 disabled, so that the normal column select signal Normal Ys is not outputted. On the contrary, when the output signal Ryi_enb keeps High level, the normal column select unit 50 receives the column address to drive the normal column driver 70 corresponding thereto, thereby enabling the normal column select signal Normal Ys. At this time, the normal column driver 70 and the normal column select unit 50 exist as many as the number of the column address.

As in the above, most of the memory semiconductors are constructed to divide the row and column addresses in order to repair fail. Of course, it would be reasonable that SDRAM is constructed as in the memory semiconductors since the row and column addresses are inputted from the outside separately. In case of SRAM, the row and column addresses are not inputted thereto dividedly but are internally dividedly used. Thus, if fail is repaired for surrounding addresses and row addresses as well as failed addresses, there is a possibility that column addresses corresponding to a block in which the memory cells are divided as well as the failed column addresses are all changed. This may cause a problem that addresses with no fail are replaced. In this case, though the failed Y addresses in the replaced row address could be repaired, fail may occur in other addresses.

SUMMARY OF THE INVENTION

Accordingly, the present invention is contrived to substantially obviates one or more problems due to limitations and disadvantages of the related art, and an object of the present invention is to provide a repair circuit in which fuses are not divided for use in row and column addresses but are constructed to have all of row and column address information in order to replace only addresses with fail, whereby if fail addresses are inputted, only corresponding addresses are replaced and remaining addresses operate as they are.

The concept of the present invention lies in that in case of random bit fail, only failed addresses are repaired by each of fail repair circuits for individual 1 bit fail. Further, the present invention is applied to memory semiconductors that are not address-multiplexed.

The repair circuit of the present invention is characterized in that it comprises:

a bit fail repair block for receiving column and row addresses to determine whether the addresses are fail addresses in order to decide whether bit repair for the fail addresses are to be performed, a row repair block for determining whether the row addresses are fail and deciding whether row repair for the row addresses are to be performed depending on the output of the bit fail repair block, and a plurality of column repair blocks for deciding whether column repair for the column addresses are to be performed and deciding whether a normal column driver must be selected, depending on the column address, column fuse boxes and an output signal of the bit fail repair block.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
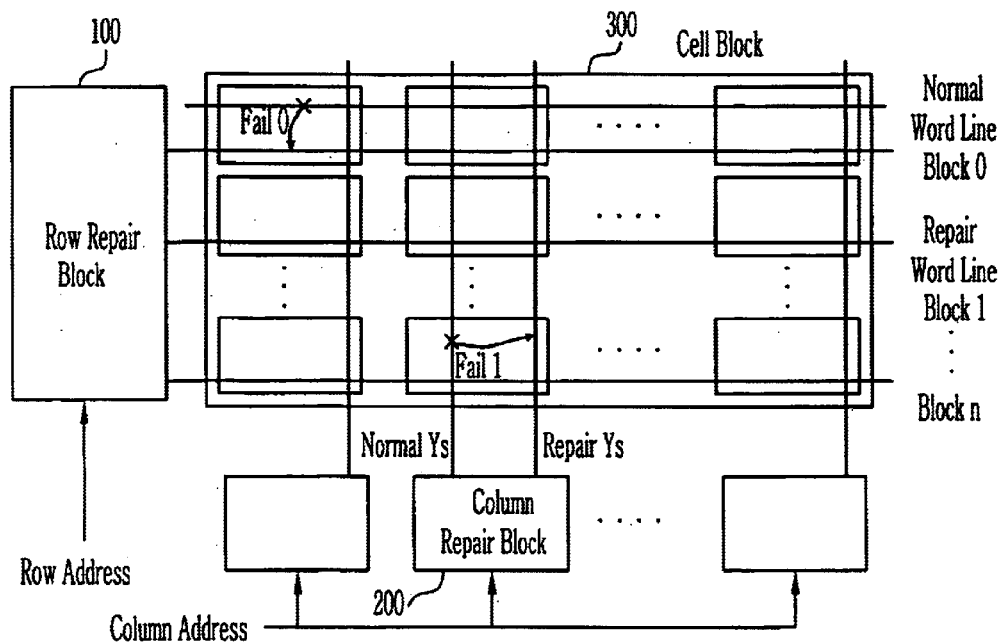
FIG. 1 is a block diagram of a repair circuit for explaining a conventional repair technology.
Figure 2:
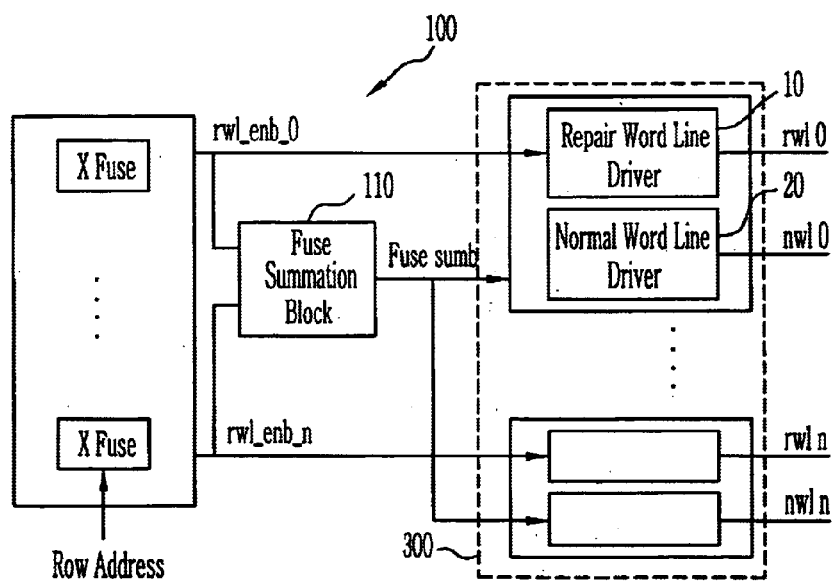
FIG. 2 is a detailed circuit diagram of the row repair block shown in FIG. 1.
Figure 3:
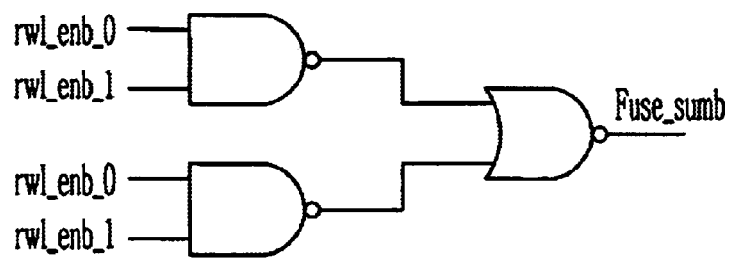
FIG. 3 is a detailed circuit diagram of the fuse summation block shown in FIG. 1.
Figure 4:
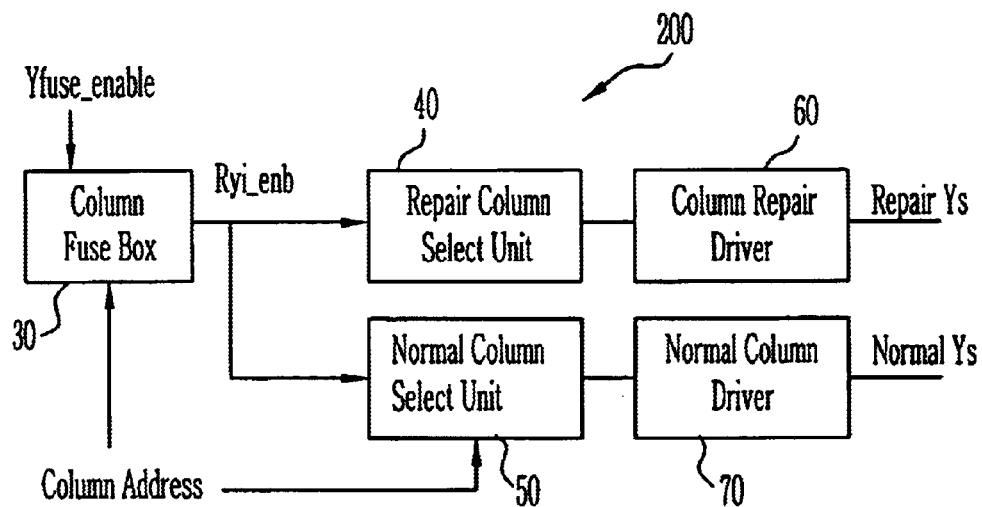
FIG. 4 is a detailed circuit diagram of the column repair shown in FIG. 1.
Figure 5:
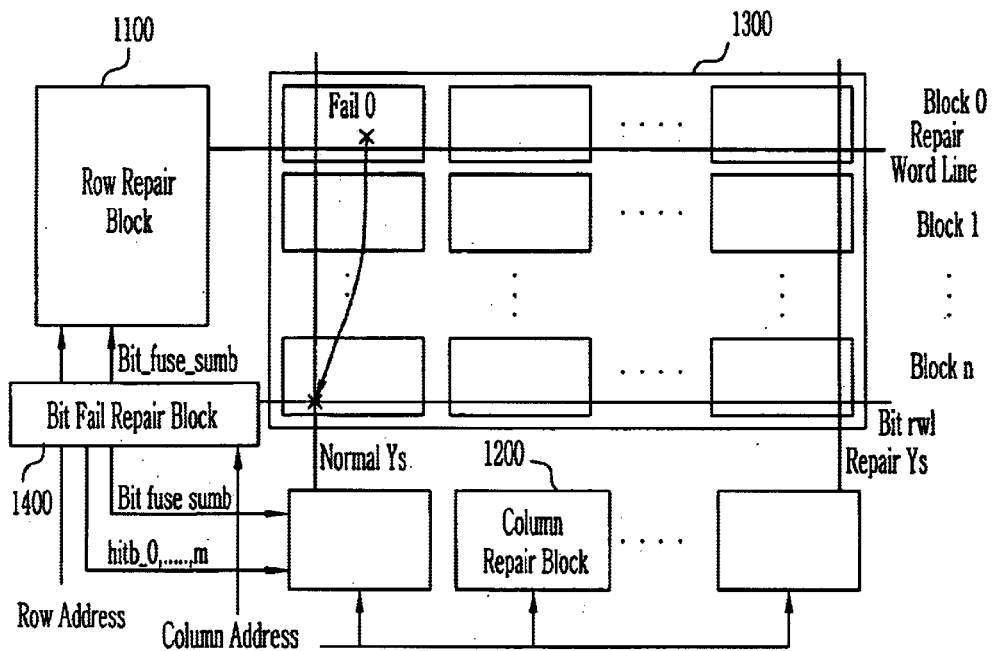
FIG. 5 is a block diagram of a repair circuit according to the present invention.

FIG. 5 is a block diagram of a repair circuit embodying the present invention. As shown in FIG. 5 the repair circuit includes a row repair block 1100, a column repair block 1200, a cell block 1300 and a bit fail repair block 1400.

Figure 6:
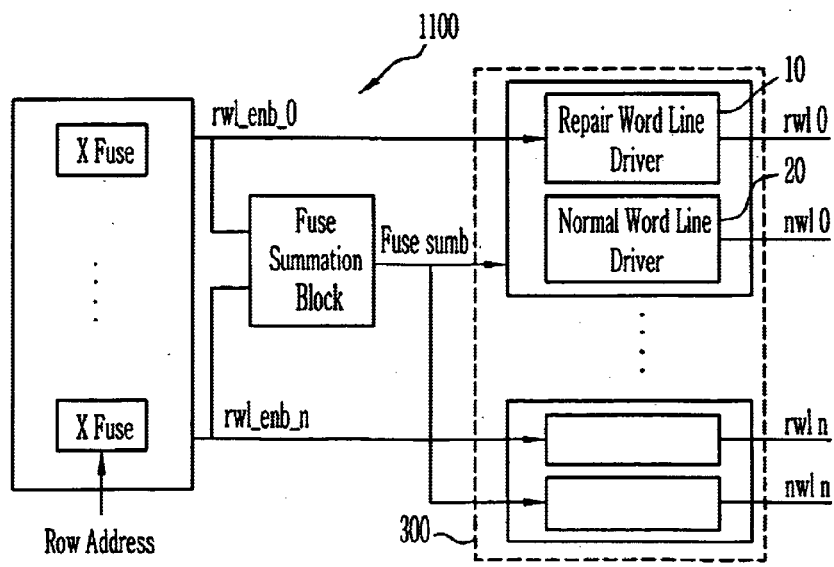
FIG. 6 is a detailed circuit diagram of the row repair block shown in FIG. 5.

The row repair block 1100 of the present invention has a detailed construction as shown in FIG. 6. Detailed explanation on the row repair block 1100 will be omitted since the construction and operation thereof are almost same to those described in the background of the related art. The row repair block 1100 employs a scheme in which the word lines are replaced using the row address only. This can be usefully applied when row fail occurs. Further, the output signal Bit_fuse_sumb of a bit fail repair block 1400 is one to disable all the normal word lines and the word lines.

The bit fail repair block 1400 will be now described.

This block 400 is a circuit for producing the above-mentioned output signal Bit_fuse_sumb.

Figure 7:
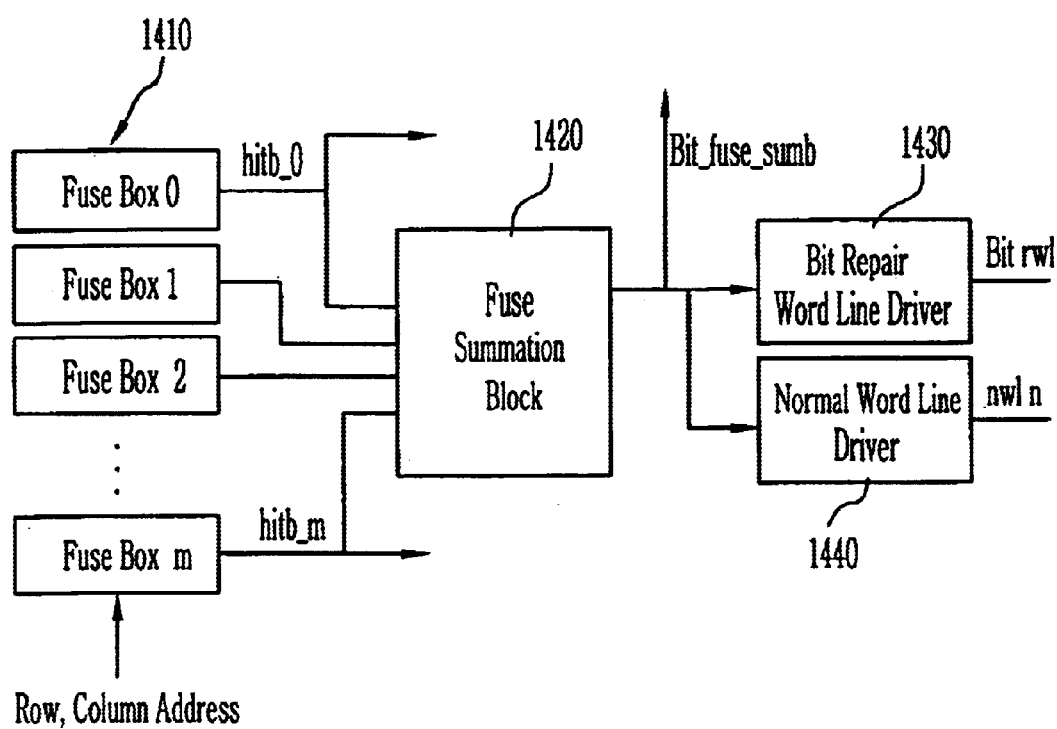
FIG. 7 is a detailed circuit diagram of the bit fail repair block shown in FIG. 5.

The block 400 includes M numbers of fuse boxes 1410, a fuse summation block 1420, a bit repair word line driver 1430 and a normal word line driver 1440, as shown in FIG. 7. Each of the fuse boxes 1410 has row and column address information.

The fuse box 1410 is a kind of a circuit wherein the properties of the above-mentioned row fuse box and the column fuse box are brought together. As the fuse box 1410 has all of address information, it functions to determine whether an address from the outside is a fail address. If it is the fail address, the fuse box outputs a control signal hitb_m of Low level. On the contra, if it is not the fail address, the fuse box outputs the control signal hitb_m of High level. The fuse summation block 1420 operates same to one described in the background of the related art. If at least one of the control signals hitb_0, . . . , hitb_m becomes Low level, the output Bit_fuse_sumb of the fuse summation block 1420 becomes Low level. If all of the control signals are High level, the output thereof operates as High level. In other words, if each of failed addresses is set to the fuse boxes 1410, respectively, the addresses operate as Low level when the fail addresses are inputted to the fuse boxes. This signal allows all the repair word line drivers and normal word line drivers not to operate, as described above. Further, the output Bit_fuse_sumb is used as a signal to enable the bit repair word line driver 1430. If the bit repair word line driver 1430 is enabled, the bit repair word line operates to be responsible for the row address.

Figure 8:
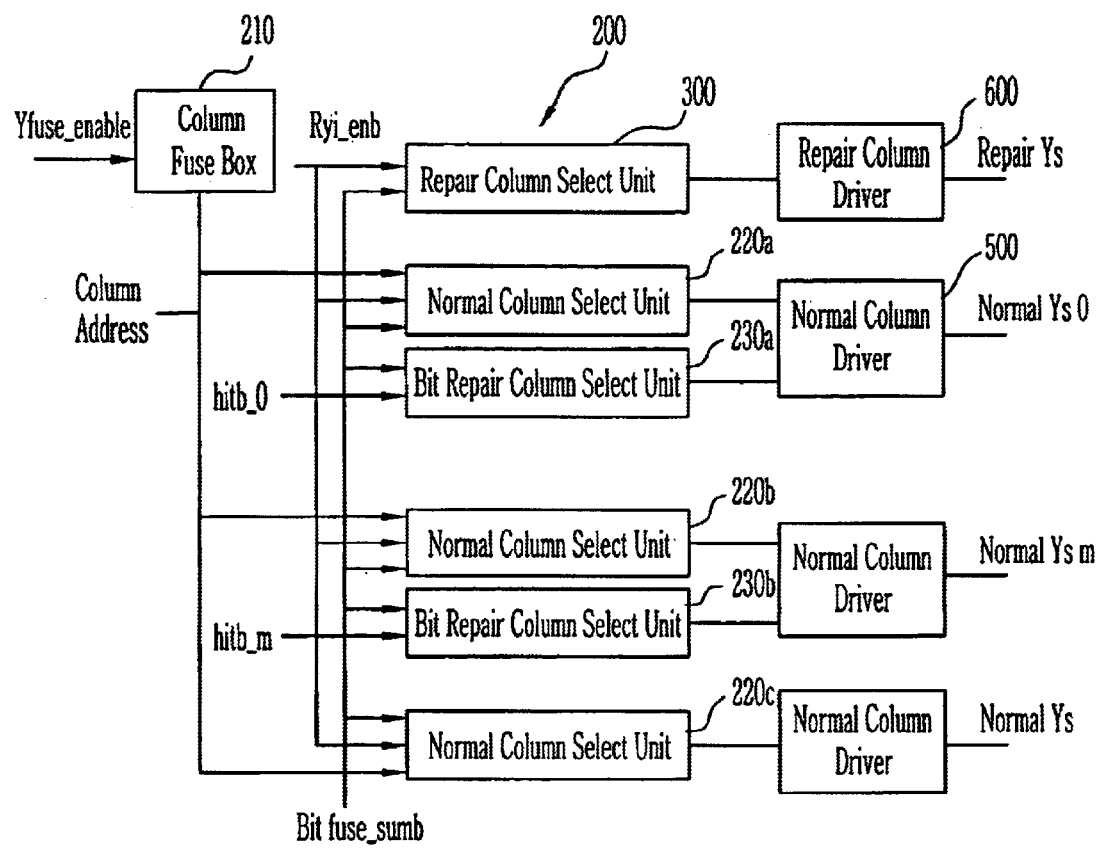
FIG. 8 is a detailed circuit diagram of the column repair block shown in FIG. 5.

Referring now to FIG. 8, the column repair block 200 will be explained. As shown in FIG. 8 the column repair block 200 includes a column fuse box 210, a repair column select unit 300, a plurality of normal column select units 220a, 220b and 220c, a plurality of bit repair column select units 230a and 230b, a normal column driver 500 and a repair column driver 600.

In FIG. 8, the reason why the column fuse box 210 exists is that the prior art is used intact and the present invention is added. This is why it could be usefully used since there are many column fail.

In the bit fail repair block 1400, the output Bit_fuse_sumb of the fuse summation block 1100 is also used in the column repair block. This signal Bit_fuse_sumb along with the output signal Ryi_enb of the column fuse box 210 is used as a signal to disable normal column select units 220a, 220b and 220c. Of course, this signal Bit_fuse_sumb enables the repair column select unit 300 as well as the normal column select units 220a, 220b and 220c. Further, the signal Bit_fuse_sumb is used as an enable signal in bit repair column select units 230a and 230b. By doing so, as other enable paths are blocked, it is possible to control the column path by means of the fuse box 1410 of the bit fail repair block 400.

If the bit repair column select units 230a and 230b are enabled by the signal Bit_fuse_sumb, it is determined which normal column select signal Normal Ys is enabled by the signal of the output hitb_m of the fuse box 1410. For example, if an address set to the fuse box is inputted as an input, it is recognized as a fail address. The output hitb_0 will be thus enabled. Due to this, if the output Bit_fuse_sumb is also enabled, the normal column select units 220a, 220b and 220c and the repair column select unit 300 are disabled. Further, the bit repair column select units 230a and 230b are enabled, only the output hitb_0 is enabled and remaining outputs hitb_m(m=1, . . . , m) are disabled. Therefore, the normal bit Normal Ys is enabled by the output hitb_0. The normal bit Normal Ys enabled by the fuse box 1410 is thus decided. The bit repair column select unit is required as many as the number of the fuse box 1410. Normal column drivers 500 are each driven by the normal column select units 220a, 220b and 220c and the bit repair column select units 230a and 230b.

The above operation will be explained again. If the fail address set to the fuse box 1410 is inputted, it disables a normal word line driver 20 and a repair word line driver 10 and enables the bit repair word line driver 1430, thereby driving the bit repair word line. The word line corresponding to the row address is driven by the bit repair word line. Also, the normal column driver 500 is driven by the fuse box 1410 that set the fail address, by disabling all the normal column select units 220a, 220b and 220c and the repair column select unit 300 and enabling the bit repair column select units 230a and 230b, thereby enabling the normal bits Normal Ys.

By the above operation, a circuit for repairing only 1 bit being a random fail bit is operated. In the present invention, data is read from the original cell if at least one fail address is wrong. Therefore, only addresses with fail are actually replaced with other cells.

As mentioned above, the present invention is related to repairing ran bit fail. In the prior fail repair circuit, addresses with no fail are together replaced. Instead, the present invention has an advantageous effect that it can manufacture semiconductor memory devices capable of repairing only fail address. Further, the present invention has a new effect that it can be applied to memory semiconductor devices that operate single write and read mode not a page mode.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A repair circuit comprising:
   A bit fail repair block for receiving column and row addresses to determine whether the addresses are fail addresses in order to decide whether bit repair for the fail addresses are to be performed;
   a row repair block for determining whether the row addresses are fail and deciding whether row repair for the row addresses are to be performed depending on the output of the bit fail repair block; and
   a plurality of column repair blocks for deciding whether column repair for the column addresses are to be performed and deciding whether a normal column driver must be selected, depending on the column addresses, column fuse boxes and an output signal of the bit fail repair block.

2. The repair circuit as claimed in claim 1, wherein the bit fail repair block comprises:
   A plurality of first fuse boxes for receiving the column and row addresses;
   a first fuse summation block for summating the outputs of the plurality of the fuse boxes;
   a normal word line driver that operates depending on the output of the fuse summation block to select a normal word line; and
   a bit repair word line driver that operates depending on the output of the fuse summation block to repair one bit.

3. The repair circuit as claimed in claim 2, wherein the first fuse summation block receives the outputs of the plurality of the first fuse boxes as inputs, and wherein if one of the inputs has a value different from the other inputs, its output value is decided by a value different from the value of the one input.

4. The repair circuit as claimed in claim 1, wherein the row repair block comprises:
   a plurality of second fuse boxes for receiving the row addresses;
   a second fuse summation block for summating the outputs of the plurality of the fuse boxes;
   a normal word line driver for enabling the normal word line depending on the output of the first fuse summation block and the output of the second fuse summation block; and
   a repair word line driver for enabling the normal word line depending on the output of the first fuse summation block and the output of the second fuse summation block.

5. The repair circuit as claimed in claim 1, wherein each of the plurality of the column repair blocks comprises:
   A column fuse box for receiving the column addresses;
   a repair column select unit for selecting column repair depending on the output of the column fuse box and the output of a first fuse summation block;
   a plurality of normal column select units for selecting a normal column depending on the column addresses, the outputs of the column fuse boxes and the output of the first fuse summation block;

a plurality of bit repair column select units for selecting a bit repair column depending on the output of the first fuse summation block and the output of the column fuse box;

a repair column driver for selecting a repair column depending on the output of the repair column select unit; and a normal column driver for selecting a normal column and a bit repair column depending on the outputs of the normal column select units and the repair column select units.

* * * * *